(12) United States Patent
Lien

(10) Patent No.: US 6,617,593 B2
(45) Date of Patent: Sep. 9, 2003

(54) ION IMPLANTATION SYSTEM

(75) Inventor: Dale A. Lien, Vancouver, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/730,206

(22) Filed: Dec. 4, 2000

(65) Prior Publication Data

US 2002/0066871 A1 Jun. 6, 2002

(51) Int. Cl.[7] .............................. G21K 5/10; H01J 37/08
(52) U.S. Cl. .............................. 250/492.21; 250/492.1; 250/492.2; 250/396 R
(58) Field of Search .............................. 250/492.21, 396

(56) References Cited

U.S. PATENT DOCUMENTS 4,283,631 A  8/1981  Turner .................. 250/482 B
5,563,418 A  * 10/1996  Leung .................. 250/492.21
5,969,366 A  * 10/1999  England et al. ........ 250/492.21
6,075,249 A  * 6/2000  Olson ................... 250/396

* cited by examiner

Primary Examiner—John R. Lee
Assistant Examiner—Erin-Michael Gill
(74) Attorney, Agent, or Firm—Blakely, Sokoloff, Taylor & Zafman LLP

(57) ABSTRACT

An ion implantation system of the kind including an ion source, an electrode plate, an extraction voltage supply, and a substrate holder is described. The electrode plate initially has an opening of about 6.35 mm which is enlarged to about 8.38 mm. The aperture is also tapered outwardly on a side thereof opposing the ion source. It has been found that such an electrode plate creates substantially lower suppression currents.

21 Claims, 2 Drawing Sheets

ION IMPLANTATION SYSTEM

BACKGROUND OF THE INVENTION

1). Field of the Invention

This invention relates to an ion implantation system, its manufacture and its method of use.

2). Discussion of Related Art

Ion implantation systems are frequently used in the manufacture of integrated circuits on wafer substrates. An ion source generates ions and an extraction voltage supply is connected between an electrode plate and the ion source such that the ions are attracted to the electrode plate. An aperture is formed in the electrode plate through which the ions pass. The ions then pass through other components that accelerate the ions and deflect them before they are implanted into a wafer substrate held by a substrate holder.

One such a system is described in U.S. Pat. No. 4,283,631. It has been found that extremely high suppression currents result due to ions that collide with an electrode plate of the ion implantation system of the '631 patent.

BRIEF DESCRIPTION OF THE DRAWINGS

The invention is described by way of example with reference to the accompanying drawings wherein.

DETAILED DESCRIPTION OF THE INVENTION

Figure 1:
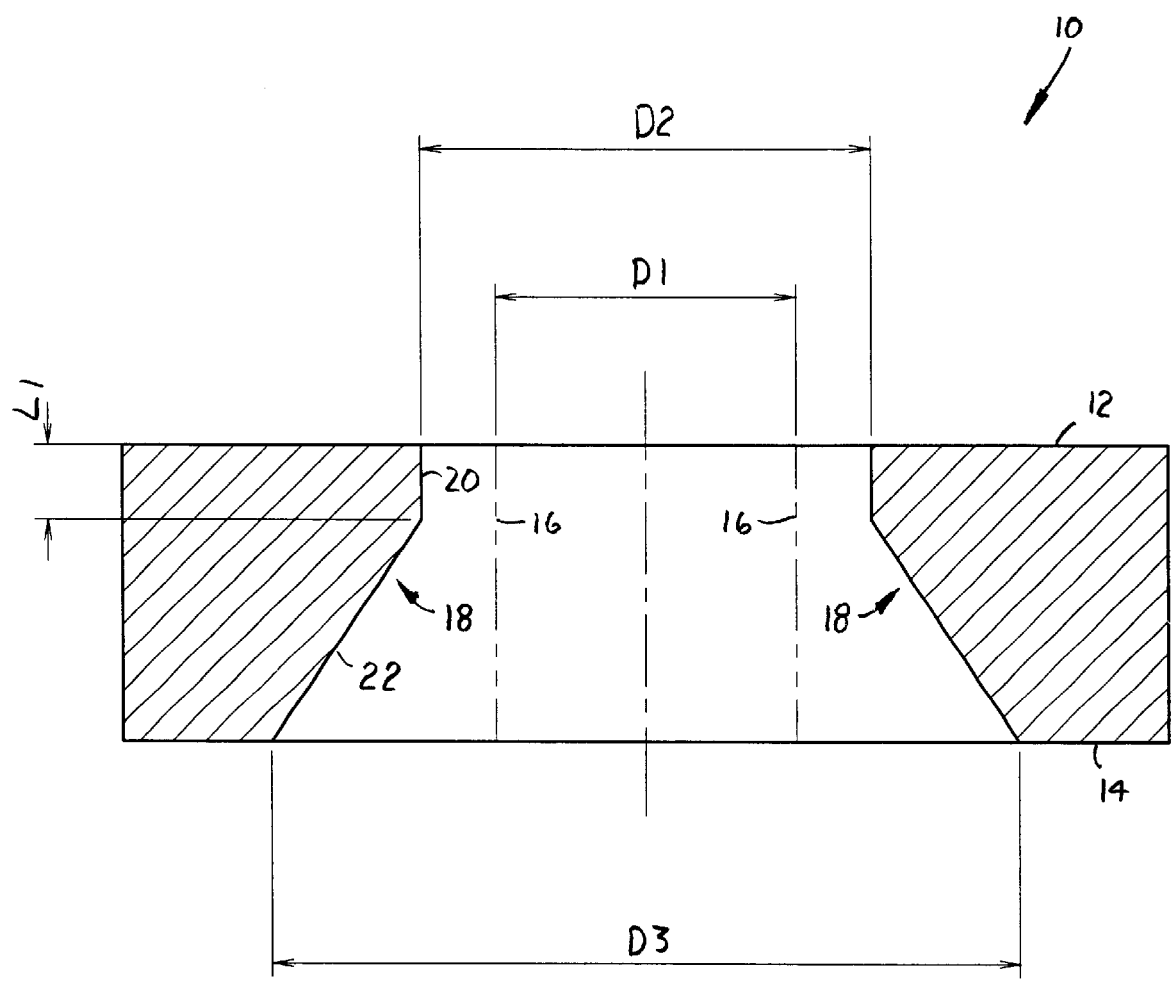
FIG. 1 is a cross-sectional side view of an electrode plate indicating modification of the electrode plate.

FIG. 1 of the accompanying drawings illustrates an electrode plate 10 which is modified according to the invention. The electrode plate 10 has first and second opposed sides 12 and 14 respectively. Before being modified, the electrode plate 10 has a circular aperture 16 extending from the first side 12 to the second side 14 therethrough. The aperture 16 has diameter D1 of 6.35 mm.

The aperture 16 is modified in a lathe to an aperture 18 which is larger than the aperture 16. The aperture 18 has a first section 20 extending from the first side 12 into the electrode plate 10, and a second section 22 extending from the first section 20 to the second side 14.

The first section 20 has a wall that extends at right angles relative to the first side 12 and has a diameter D2 of 8.38 mm. It is generally preferred that the diameter D2 be at least 7 mm more preferably at least 8 mm. The first section 20 extends for a length L1 of 3.17 mm. It is generally preferred that the length L1 be less than 4 mm.

The second section 22 extends from the first section 20 and has a wall at an angle other than at right angles relative to the second side 14. As such, the second section 22 has a diameter D3 at the second side 14 of 11.55 mm. It is generally preferred that the diameter D3 be at least 2 mm larger than the diameter D2.

Figure 2:
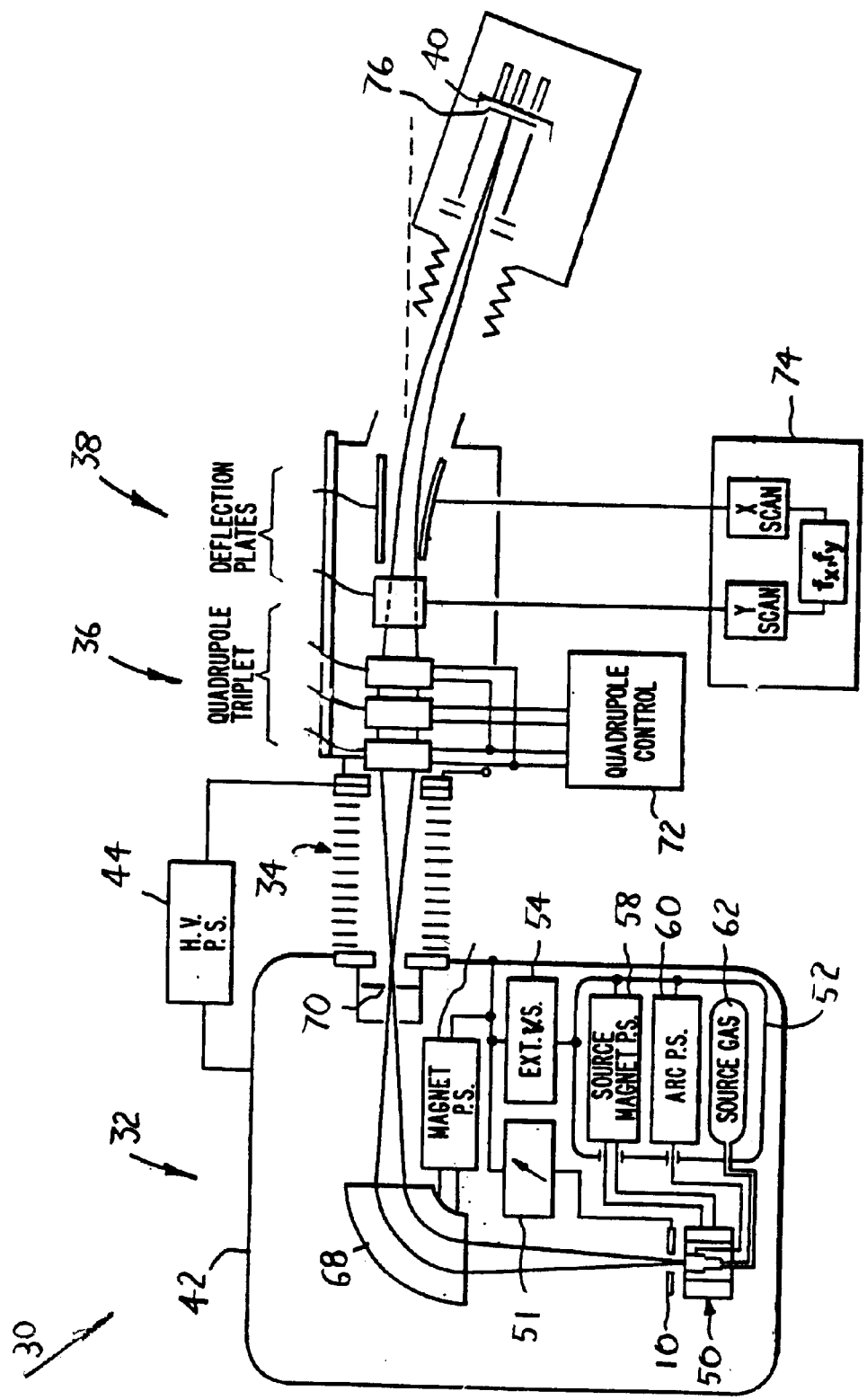
FIG. 2 is a top plan view of an ion implantation system using the electrode plate.

FIG. 2 illustrates an ion implantation system 30 according to an embodiment of the invention. The system 30 includes a mass analyzer 32, an accelerator tube 34, a quadrupole triplet 36, deflection plates 38, and a substrate holder 40.

The mass analyzer 32 includes a high-voltage chamber 42. One end of the accelerator tube 34 is attached to the high-voltage chamber 42. An opposing end of the accelerator tube 34 is connected to ground. A high-voltage power supply 44 is connected between the end of the accelerator tube 34 connected to ground and the high-voltage chamber 42. The high-voltage chamber 42 is held at a first voltage by the high-voltage power supply 44.

The mass analyzer 32 further includes an ion source 50 and the electrode plate 10 located within the high-voltage chamber 42. A vernier adjuster 51 is connected between the electrode plate 10 and the high-voltage chamber 42. The vernier adjuster 51 maintains the electrode plate 10 at a second voltage which is lower than the first voltage of the high-voltage chamber 42. The electrode plate 10 is located adjacent the ion source 50 with the first side (reference numeral 12 in FIG. 1) facing towards the ion source 50.

The mass analyzers 32 further includes a holding chamber 52 located within the high-voltage chamber 42 for holding components that are connected to the ion source 50. An extraction voltage supply 54 is connected between the high-voltage chamber 42 and the holding chamber 52. The extraction voltage supply 54 maintains the holding chamber 52 at a third voltage which is different from the first voltage of the high-voltage chamber 42 and different from the second voltage of the electrode plate 10.

The components of the mass analyzer 32 located within the holding chamber 52 include a source magnet power supply 58, an arc power supply 60, and a source gas 62. The source gas 62 is connected to the ion source 50 to provide flow of a gas into the ion source 50. The arc power supply 60 is connected between the holding chamber 52 and an ionizing filament of the ion source 50. The arc power supply 60 maintains the ionizing filament of the ion source 50 at a fourth voltage which is different from the first, second, and third voltages. The source magnet power supply 58 is connected between the holding chamber 52 and the ion source 50 so as to create an axial magnetic field across a discharge region of the ion source 50. The axial magnetic field is at a voltage potential which is different to a voltage potential of the electrode plate 10.

In use, a gas flowing from the source gas 62 into the ion source 50 is ionized by the arc power supply 60. The power supply 60 sustains an ion discharge by the filament of the ion source 50. Ions generated by such ionization are attracted to the electrode plate 10 because of a voltage difference between the discharge region of the ion source 50 and the electrode plate 10, and therefore because of a voltage difference between the ions and the electrode plate 10. The ions move towards the electrode plate 10 and then pass through an aperture in the electrode plate 10. An analyzer magnet 68 of the mass analyzer 32 deflects the ions towards an exit slit 70. The ions then pass through the exit slit 70 and then experience a voltage drop as they pass through and are accelerated through the accelerator tube 34.

The ions then pass through the quadrupole triplet 36 which is controlled by a quadrupole control 72. The ions then pass through the deflection plates 38 which are controlled by a scanning system 74. The scanning system 74 can apply a variable voltage to selected ones of the deflection plates 38 so that the ions are deflected onto a desired region of a substrate 76 which is held by the substrate holder 40. By varying the voltages of the scanning system 74, implantation locations of ions into the substrate 76 can be scanned across the substrate 76.

Further details of the system 30 are described in U.S. Pat. No. 4,283,631, incorporated herein by reference.

The electrode plate 10 is initially unmodified and therefore has an aperture such as the aperture 16 in FIG. 1. The electrode plate 10 is then removed from its location adjacent the ion source 50 and from the system 30. The electrode plate 10 is then modified as discussed with reference to FIG. 1, i.e. so as to have the aperture 18. The electrode plate 10 is then located back into its position adjacent the ion source 50 with the first side 12 facing toward the ion source 50, and connected to the vernier adjuster 51.

It has been found that the electrode plate 10 before being modified creates extremely high suppression currents through the arc power supply 60. By modifying the electrode plate 10 as described with reference to FIG. 1, the suppression currents through the arc power supply 60 are dramatically reduced.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. An ion implantation system comprising:

an ion source that generates ions;

an electrode plate adjacent the ion source, having a first side facing the ion source, a second side facing away from the ion source, and an aperture formed from the first side to the second side therethrough, the aperture including a first section having a wall extending substantially at right angles from the first side, and a second section having a wall that is tapered to extend from the first section to the second side at an angle other than at right angles relative to the second side so that the aperture is larger at the second side than at the first side;

an extraction voltage supply connected between the ion source and the electrode plate to maintain a voltage potential between the ions and the electrode plate so that the ions are attracted to the electrode plate, and then pass through the aperture; and a substrate holder positioned in a path of the ions after leaving the aperture so that the ions are implanted into a substrate held by the substrate holder.

2. The ion implantation system of claim 1 wherein the aperture is at least 8 mm.

3. The ion implantation system of claim 2 wherein the aperture is about 8.38 mm.

4. The ion implantation system of claim 1 wherein the aperture is at least 7 mm in diameter.

5. The ion implantation system of claim 1 wherein the aperture is at least 2 mm larger at the second side than at the first side.

6. The ion implantation system of claim 5 wherein the aperture is about 11.55 mm at the second side.

7. The ion implantation system of claim 1 wherein the first section is less than 4 mm long.

8. The ion implantation system of claim 7 wherein the first section is about 3.17 mm long.

9. The ion implantation system of claim 1 further comprising:

a source magnet power supply creating an axial magnetic field across a discharge region of the ion source.

10. The ion implantation system of claim 9 further comprising:

an arc power supply to sustain an ion discharge from the ion source.

11. The ion implantation system of claim 1 further comprising:

an accelerator tube through which the ions pass after leaving the aperture; and a high-voltage power supply creating a voltage drop over the accelerator tube.

12. The ion implantation system of claim 11 further comprising:

deflection plates on opposing sides of the ions after leaving the accelerator tube; and a scanning system applying a variable voltage to the plates.

13. A method of making an ion implantation system, comprising:

(i) removing an electrode plate from adjacent an ion source;

(ii) forming an aperture of at least 7 mm into the removed electrode plate, the aperture extending from a first to a second side of an electrode plate and including a first section having a wall extending substantially at right angles from the first side, and a second section having a wall that is tapered to extend from the first section to the second side at an angle other than at right angles relative to the second side:

(iii) replacing the electrode plate adjacent the ion source so that the first side faces the ion source; and (iv) connecting an extraction voltage supply between the ion source and the electrode plate to maintain a voltage potential between ions generated by the ion source and the electrode plate, so that the ions are attracted to the electrode plate, whereafter the ions pass through the aperture, a substrate holder being positioned to a hold substrate in a path of the ions after leaving the aperture so that the ions are implanted into a substrate held by the substrate holder.

14. A method of using an ion implantation system, comprising:

(i) generating ions;

(ii) creating a voltage between the ions and an electrode plate thereby attracting the ions to the electrode plate, the electrode plate having an aperture through which the ions pass, the aperture including a first section having a wall extending substantially at right angles from the first side, and a second section having a wall that is tapered to extend from the first section to the second side at an angle other than at right angles relative to the second side so that the aperture is larger on a side of the electrode plate where the ions exit the electrode plate than on a side where the ions enter the electrode plate; and (iii) implanting the ions into a substrate.

15. The method of claim 14 wherein the aperture is at least 7 mm.

16. The method of claim 15 wherein the aperture is at least 8 mm.

17. The method of claim 16 wherein the aperture is about 8.38 mm.

18. The method of claim 17 wherein the aperture is at least 2 mm larger at the second side than at the first side.

19. The method of claim 18 wherein the aperture is about 11.55 mm at the second side.

20. The method of claim 14 herein the first section is less than 4 mm long.

21. The method of claim 20 wherein the first section is about 3.17 mm long.

* * * * *